DIODE CIRCUITS AND DIODES THEREFOR

Filed June 18, 1963 2 Sheets-Sheet 1

INVENTORS
Joseph Lindmayer
Charles Y Wrigley
BY
Connolly and Hutz
ATTORNEYS

Jan. 23, 1968 J. LINDMAYER ET AL 3,365,627

DIODE CIRCUITS AND DIODES THEREFOR

Filed June 18, 1963 2 Sheets-Sheet 2

INVENTORS
Joseph Lindmayer
Charles Y Wrigley
BY Connolly and Hutz
ATTORNEYS

United States Patent Office 3,365,627

Patented Jan. 23, 1968

3,365,627

DIODE CIRCUITS AND DIODES THEREFOR

Joseph Lindmayer and Charles Y. Wrigley, Williamstown, Mass., assignors to Sprague Electric Company, North Adams, Mass., a corporation of Massachusetts Filed June 18, 1963, Ser. No. 288,798
2 Claims. (Cl. 317—234)

The present invention relates to electronic circuits such as are used in audio and television receivers as well as in computers and the like.

Among the objects of the present invention is the provision of novel diode circuits that are relatively simple and can be used in place of more complicated prior art circuits.

Further objects of the present invention include the provision of novel diodes for the above diode circuits.

The above as well as additional objects of the present invention will be more fully understood from the following description of several of its exemplifications, reference being made to the accompanying drawings wherein.

According to the present invention a diode of very desirable characteristics is of the micro-junction type consisting essentially of a junction between a first semiconductor zone doped to provide at least about $10^{17}$ impurity atoms per cubic centimeter and a second semiconductor zone having less than about $10^{14}$ impurity atoms per cubic centimeter, a third semiconductor zone having the same type of conductivity as the second semiconductor zone and at least about $10^{17}$ impurity atoms per cubic centimeter, the third zone merging into the second zone over a distance of about 0.05 to about 5 mils, and terminals ohmically connected to the first and third zones. The impurity atoms referred to above are those that activate the semiconductor to carry electric current by contributing an excess of electrons or of holes, as is well known.

The above diode can be made to develop a negative resistance when it is subjected to alternating electric signals having a frequency as low as about 1 megacycle per second or as high as about 1,000 megacycles per second and at voltages from a fraction of a volt to several volts. It also shows a frequency-dependent response which is quite steep in some frequency ranges which can be as low as about 1 megacycle per second and as high as about 100 megacycles per second. This unusually strong frequency-dependent characteristic makes it very desirable for use as a simple FM discriminator, particularly for home type FM radio receivers and television receivers which can have intermediate sound frequencies as low as 10.7 megacycles per second or lower.

The negative resistance characteristic makes the diode suitable for shift networks as in memory or logic circuits and the like where the alternating electric signals can be supplied through wireless (non-ohmic) coupling connections. Because non-ohmic connections can thus be used and the need for physical contacts thereby diminished, such circuits are easier to assemble, particularly in the micro form where large numbers of individual circuits are packed as closely as possible in a very small space.

Figure 1:
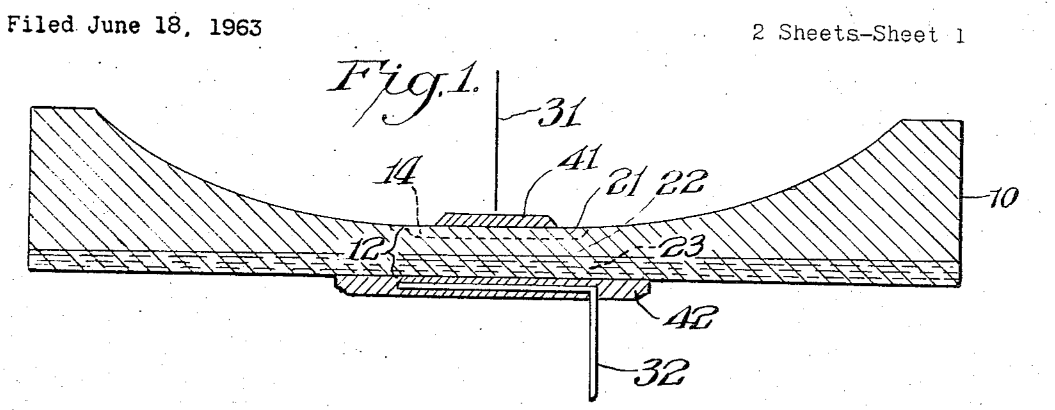
FIG. 1 is a cross-sectional view of a diode representative of the present invention.

Turning now to the drawings, the diode of FIG. 1 has a wafer body 10 of germanium, silicon, or other semiconductor, with an active thickness of about 0.3 to 5 mils. This thickness is indicated at 12. One way of providing such an active thickness is from a thicker wafer by electrolytic etching, as described for example in U.S. Patent 2,870,052, granted Jan. 20, 1959. The etching can be carried out at only one face of the wafer, as indicated in FIG. 1, or at both opposed faces of the wafer, as indicated in the patent.

A micro-type junction 14 is provided in the active part of the area by a shallow but heavy doping so as to produce a zone 21 having about $10^{18}$ impurity atoms per cubic centimeter. A suitable doping technique for this purpose is also described in the above-identified patent although any other technique can also be used.

Adjacent the opposite face of wafer 10 is another zone 23 also doped to the same degree, that is so as to contain about $10^{18}$ impurity atoms per cubic centimeter, but the impurity atoms of zone 23 are of opposite conductivity as compared with those of zone 21.

Between zones 21 and 23 is a zone 22 which is of the same type of conductivity as zone 23 and in which the concentration of impurity atoms gradually reduces from the high concentration adjacent zone 23 to a level below $10^{14}$ impurity atoms per cubic centimeter at junction 14. In other words, the junction 14 is a relatively abrupt one with heavy doping on one side and very little or no doping on the other, the low dope or no dope zone gradually merging into a more heavily doped zone without any further junction. The doping of zones 22 and 23 has a graded impurity distribution and is preferably provided by the use of an overall doping step which is not of the micro type used for zone 21, and which contributes the heavily doped region adjacent the lower wafer surface, as shown in the figure, and the deeper diffused band of more light doping that gradually fades away.

Contacts 31 and 32 are ohmically connected to the respective zones 21, 23 as by means of the usual type of solder 41, 42 such as those mentioned in the above- identified patent, or by means of thermal compression bonding or the like.

Zone 21 is preferably about 0.01 to 0.001 of a mil in overall depth and less than about 60 square mils in transverse area. In addition, the distance between junction 14 and zone 23 where the impurity atom concentration reaches about $10^{17}$ atoms per cubic centimeter is preferably 0.1 to 0.3 mil. The diode can have constructions different from that described above, but the above construction gives outstanding results when using its frequency-dependent characteristics, as for example in an FM discriminator. Other methods of providing the diode junction such as out-diffusion (see for example U.S. Patent 2,900,286, granted Aug. 18, 1959) or epitaxial growth, or combinations of such methods, can be used.

The diode can be encased so as to protect it from outside influences, particularly if the semiconductor from which it is made is germanium, but in some environments as in the interior of a home-type radio or television receiver, the diode can be entirely unencased. Silicon-type diodes need less protection and can in most cases be left uncovered. Potting of the diodes is, however, a simple operation and in general does not seem to interfere with its operation.

EXAMPLE

A germanium diode of the type illustrated in FIG. 1, having a zone 22 thickness of 0.1 mil, a zone 21 doping of $10^{18}$ atoms of cadmium per cubic centimeter and a zone 23 doping of $10^{19}$ atoms of arsenic per cubic centimeter, in which zone 22 is provided by thermal dicusion, and zone 21 is 50 square mils in transverse area, has a discrimination sensitivity which is about 500 millivolts per megacycle at 30 megacycles per second. It gives very efficient discrimination action with FM signals having frequencies from 10 to 40 megacycles per second and with input signals having an amplitude of about 0.3 to about 1.5 volts.

Figure 2:
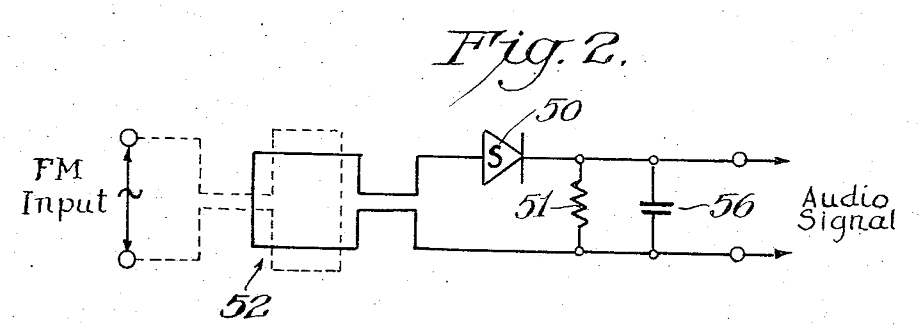
FIG. 2 is a general form of circuit according to the present invention.

FIG. 2 shows a general form of FM discrimination circuit using the diode of FIG. 1 at 50. FM signals are supplied to the diode through coupling loops 52, and the output of the diode is developed across load resistor 54 which is preferably by-passed by a capacitor 56 that dissipates the demodulated carrier. The audio signals with which the FM signals were modulated are taken off from across resistor 54 and can be further amplified or fed to utilizing circuits.

Figure 3:
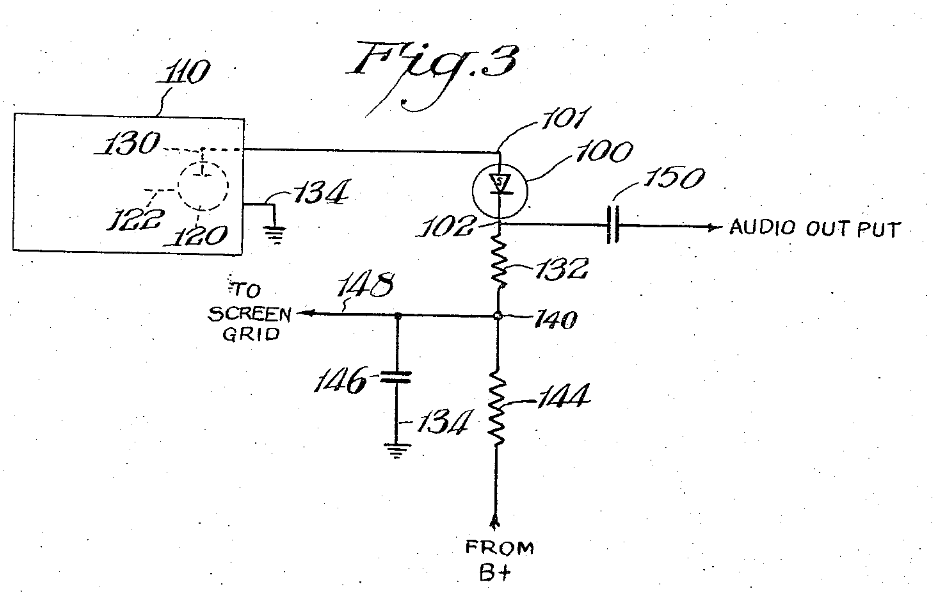
FIG. 3 is a schematic diagram of a specific circuit illustrative of the present invention.

FIG. 3 illustrates an FM discriminator arrangement for a home type FM radio receiver. The frequency responsive diode is indicated at 100, and it is supplied with FM signals from an IF strip 110. Such a strip 110 usually contains several stages of vacuum type pentode amplifiers which are also limiters and at least the last stage of which is a limiter. The stages have tuned input and output circuits so that they receive and amplify signals in a fairly narrow frequency band generally having a center or carrier frequency of 10.7 megacycles per second. The vacuum tube in the last stage is indicated at 120 and its input grid at 122. The particular type of operating conditions used in the IF stages is not important and many typical ones are shown in Rider's Specialized HI-FI AM-FM Tuner Manual, vol. 1, copyright 1955 by John F. Rider, published by John F. Rider, Publisher, Inc., New York, N.Y.

In accordance with the present invention the anode lead 130 from tube 120 is directly connected to one terminal 101 of diode 100 while the other terminal 102 of the diode is directly connected through load resistor 132 to a source 140 of B+ power for operating the tube. In the particular embodiment illustrated source 140 is the output terminal of a voltage dropping resistor 144 which terminal is heavily by-passed by a filter capacitor 146 that returns to the common signal return 134. At terminal 140 there is accordingly a substantially unvarying B+ voltage free of any signal modulations. This terminal can then not only be used to supply the anode circuit of the tube 120, but also as shown by lead 148 can supply the screen grid terminal of the same tube. An output coupling capacitor 150 is connected to diode terminal 120 and delivers demodulated signals as an audio output to one or more amplification stages not shown.

It will be noted that the output of tube 120 does not have a tuned circuit such as the discriminator transformer normally used and that the diode 100 and load resistor 132 are used in place of such prior art IF output circuits. The diode 100 is connected so as to pass the B+ plate current in its forward conductive direction, and at the frequency of the IF output signals the diode develops a frequency responsive variation in voltage across the load resistor 132. This frequency responsive characteristic is of relatively high sensitivity so that a very strong demodulated output voltage is recoverable from the load resistor. By way of example, in a commercially manufactured FM radio receiver for home use, the discriminator circuit was replaced by that shown in FIG. 3 using a diode as described in the example with a load resistor 132 of 500 ohms and a coupling capacitor 150 of 0.5 microfarad. The source of B+ power was not disturbed and had 85 volt potential applied through resistor 144 which was 15,000 ohms and was by-passed with capacitor 145 of 1,000 micro-microfarads. The B+ potential at terminal 140 was 50 volts and tube 120 was of type 19T8. The output of the modified receiver was substantially identical in all respects to the output before the modification was made.

FIG. 3 does not show load resistor 132 by-passed with respect to the intermediate frequency inasmuch as the audio amplification stages do not require such by-passing. However, if desired a small by-pass capacitance such as one of from about 10 to about 5,000 micro-microfarads can be directly connected between terminal 102 and the signal return. It is also suitable to provide a more complete filtering circuit ahead of load resistor 132 as by inserting between it and terminal 102 a series filtering resistor having a resistance 5 to 10 percent the resistance of resistor 132, and the filtering resistor can be by-passed to the common signal return by an appropriate capacitor at either or both terminals of the series resistor. The diode output can then be taken from the load resistor 132 on the output side of the filter circuit.

It will be noted that the discriminator circuit of FIG. 3 has no tuned components and is also free of inductances. It is accordingly of exceedingly simple nature and requires no adjustment so that it greatly reduces the manufacturing expense of discriminators.

The discriminator circuit of the present invention can also be used with other types of IF strips or sources of FM signals. It can be used, for example, with transistor-type FM amplifiers and the only change involved in such use would be to lower the resistance of load resistor 132 so as to mtach the operating impedances of transistor outputs. The diode 100 may also have to be reversed in polarity where the transistor circuit in which it is inserted has the DC current flowing in the opposite direction. For example, diode 100 can be connected to the collector of an NPN type junction transistor used as an IF amplifier and the diode would then have its leads interchanged so that terminal 102 would be connected to the transistor's collector and terminal 101 would then be connected to the load resistor in the discriminator circuit.

Television receivers such as those of the standard home variety, also have FM audio stages in their sound sections and these sections can advantageously include the discriminator circuits of the present invention. The intermediate frequencies of such sound sections generally range from about 4 to about 44 megacycles per second.

Figures 4, 5, 6:
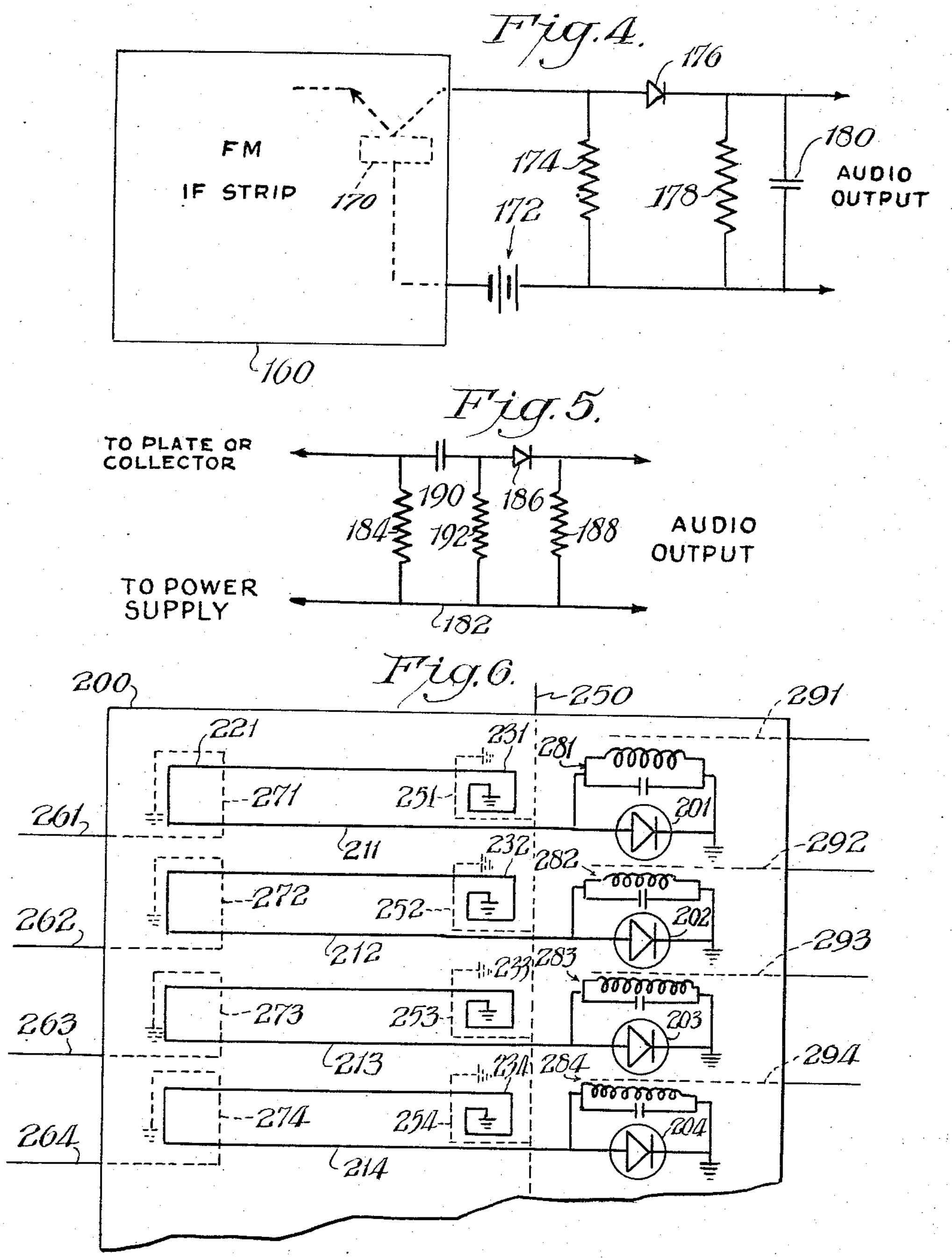
FIGS. 4 and 5 are schematic diagrams similar to FIG. 3 of alternative circuits according to the present invention.
FIG. 6 is a partially schematic representation of another type of circuit illustrative of the present invention.

It is not necessary to have the diode of the demodulation circuit in series in the power supply of an amplification stage. FIG. 4 shows an alternative circuit in which a transistor type FM intermediate frequency strip 160 has its last stage 170 driven by a power supply such as battery 172 through an IF load resistor 174. The frequency-responsive diode of the present invention is shown at 176 as connected in a parallel circuit that includes demodulator load resistor 178 and which bridges the IF load resistor 174. An IF by-pass resistor 180 is here illustrated as connected across the demodulator load resistor 178 and the desired diode output can be taken from across that load resistor.

FIG. 5 shows a further modified FM demodulation circuit in accordance with the present invention in which the frequency responsive diode is isolated from the direct current in the IF output circuit. The frequency-responsive diode is here indicated at 186 in a demodulation circuit that includes a demodulator load resistor 188 similar to resistor 178 of FIG. 4. The IF output signal is supplied to the demodulator circuit through a blocking capacitor 190 connected to an IF output load resistor 184 that may in turn form part of an IF network of the type shown in FIG. 3 or FIG. 4. An additional resistor 192 can be connected to the signal return line 182 from the input terminal of the diode 186 to complete a DC circuit for the diode, if desired. Resistor 192 can also be omitted. Diode 186 does not require any DC isolation from the input of whatever type of circuit utilizes the diode output of the construction of FIG. 4 so that it is not necessary to use a blocking capacitor in the diode output connection, but a blocking capacitor can be so used if desired.

The coupling of the demodulator circuit of the present invention to a source of frequency modulation signals such as the above IF networks or even to an RF signal source, while very desirably in the form of the simple RC circuits referred to above, will also operate although not quite as well, with inductance or transformer coupling.

Diodes providing discrimination sensitivity of at least about 200 millivolts per megacycle are sufficiently effective to be used without requiring any amplification beyond what is ordinarily used in the art. In addition to the micro-junction constructions referred to above, diffused junctions, particularly of the alloy-diffused type, and epitaxially grown junctions provide the above minimum sensitivity. At some range of frequency generally about 50 megacycles per second, the frequency responsive characteristics of the diodes go through a minimum, and above that range, that is at about 70 to 120 megacycles per second in some cases there is another band in which very effective discrimination is accomplished. By varying the diode construction the range of frequencies in which demodulation is effected can be varied somewhat.

The frequency-responsive characteristics of the diodes of the present invention can also be used for other purposes such as to provide a DC output indicative of the frequency of impressed signals so as to measure that frequency in a very simple manner. Another use is to regulate the oscillation frequency of a high frequency generator as by varying the bias of a reactance tube circuit to the diode DC output when it is supplied with the oscillations produced by the generator, and the oscillation frequency can be kept from undergoing variations. A similar control can be arranged with a variable-capacitance diode used in place of the reactance tube and subjected to the output of a frequency-responsive diode.

The diodes of the present invention also show a negative resistance characteristic when they are supplied with alternating electric signals of relatively high frequencies. The negative resistance characteristic develops at relatively low as well as high voltages. Inasmuch as such high frequency signals can be supplied to the diodes by capacitive, inductive, or radiation type pickups and the negative resistances can be used for memory storage and logic circuits, the diodes are particularly suitable for simplified assembly in arrays or matrices or the like where close packing is desired.

FIG. 6 illustrates a matrix assembly of the above type using non-ohmic connections. A plurality of diodes 201, 202, 203, 204, etc., is connected to individual supply leads 211, 212, 213, 214, etc., each shown as including two inductors in series. Lead 211, for example, has a portion looped around as indicated at 221 to provide one inductor and another portion shown at 231 looped around to provide the second. Similar inductors are shown at 222 and 232 for supply lead 212 and corresponding ones for the other supply leads. The above leads and the inductances can all be made in printed circuit form on one face of a panel 200. On the opposite face of the panel single supply lead 250 is connected in common to similar individual inductors 251, 252,, etc., each placed in relatively close mutually inductive relationship with respective inductors 231, 232, etc.

The same face that carries supply lead 250 also carries a set of additional supply leads 261, 262, etc., each separately connected to individual inductors 271, 272, etc. The latter inductors are separately in relatively close mutual inductive relationship to individual inductors 221, 222, etc.

The individual diodes are arranged to indicate when they are in negative resistance condition as by having them each connected in parallel to a different resonant circuit 281, 282, etc. Adjacent each resonant circuit is an antenna pickup 291, 292, etc., that picks up through radiation or induction a signal corresponding to that developed in its adjacent resonant circuit.

These resonant circuits as well as all supply leads can also be made in printed circuit form although this is not essential, and the diodes can have their semiconductive bodies directly soldered in place against at least one of the leads to which they are connected. Evaporated metal circuits are another desirable form of this construction, particularly for integrated microcircuits. Piezoelectric forms of resonant circuits are also satisfactory.

Supply lead 250 can be used to deliver high frequency current at a voltage not sufficient to bring the diodes into their negative resistant state. For example, they can be arranged to develop at the diode an RF potential of about $\frac{3}{10}$ volt. Leads 261, 262, 263, etc., can be connected to individual logic or information supply sources of high frequency signals and a relatively small signal so supplied will then shift the diodes to their negative resistant state. In such condition their negative resistance is arranged to cause their respective resonant circuits to generate oscillations. A source of low DC voltage such as 1 to 3 volts can be connected to each resonant circuit, or as illustrated in FIG. 6 the high frequency energy supplied through the various leads can be relied on to deliver the energy needed to cause oscillation. The frequency of the energy supplied through lead 250 need not be the same as that relied on to supply the triggering action through leads 261, 262, etc. In addition, the respective oscillator circuits 281, 282, etc., can be arranged to oscillate at still different frequencies so that the appearance of the oscillations can be readily monitored through the antennas 291, 292, etc.

The close packing of a stack of assemblies of the type shown in FIG. 6, or better still of integrated semiconductor micro-circuit assemblies, takes advantage of such different frequencies to reduce extraneous coupling. The different output frequencies can also be developed in a single output circuit from which individual frequencies can be filtered out to supply any desired piece of information.

Instead of the mutually inductive coupling relied on to deliver connecting signals to the diodes, these signals can be capacitively supplied, in which event the respective diode leads 211, 212, etc., can be relatively wide coatings on panel 200, and the supply circuits on the opposite face of the panel can also have relatively wide coatings in capacitive relationship thereto. In fact, the diodes can each be directly assembled on the board so as to have their semiconductor bodies soldered to one of the capacitive coatings. Radiation type coupling can be used in the input circuits as well as in the output circuits, and if desired any or all three types of non-ohmic connections can be used in other combinations.

Obviously many modifications and varitions of the present invention are possible in the light of the above teachings. It is, therefore, to be understood that within the scope of the appended claims the invention may be practiced otherwise than as specifically described.

What is claimed is:

1. A diode consisting essentially of a micro-junction between a first semiconductor zone about 0.01 to 0.001 of a mil in overall depth and less than about 60 square mils in transverse area doped to provide at least about $10^{17}$ impurity atoms of one conductivity type per cubic centimeter and a second semiconductor zone having less than about $10^{14}$ impurity atoms of the opposite conductivity type per cubic centimeter, a third semiconductor zone having the same type of conductivity as the second semiconductor zone and at least about $10^{17}$ impurity atoms per cubic centimeter, the third zone merging into the second zone over a distance of about 0.1 to 0.3 mil, and terminals ohmically connected to the first and third zones.

2. A circuit having the diode of claim 1, a source of separately generated alternating electric signals having a frequency higher than about 1 megacycle per second connected to supply to the diode signals having such frequency and also having a potential of the order of one volt to develop a negative resistance in the dioed, and a load connected to the diode.

References Cited

UNITED STATES PATENTS

| | | | |
|---|---|---|---|
| 2,908,871 | 10/1959 | McKay | 317—235 |
| 3,254,275 | 5/1966 | Lob | 317—235 |

JAMES D. KALLAM, *Primary Examiner.*

JOHN W. HUCKERT, *Examiner.*

J. D. CRAIG, *Assistant Examiner.*